United States Patent
Jensen et al.

(10) Patent No.: US 8,354,743 B2
(45) Date of Patent: Jan. 15, 2013

(54) MULTI-TIERED INTEGRATED CIRCUIT PACKAGE

(75) Inventors: Ronald James Jensen, Bloomington, MN (US); David Scheid, Eau Claire, WI (US)

(73) Assignee: Honeywell International Inc., Morristown, NJ (US)

( * ) Notice: Subject to any disclaimer, the term of this patent is extended or adjusted under 35 U.S.C. 154(b) by 336 days.

(21) Appl. No.: 12/694,898

(22) Filed: Jan. 27, 2010

(65) Prior Publication Data
US 2011/0180919 A1    Jul. 28, 2011

(51) Int. Cl.
*H01L 23/02* (2006.01)
(52) U.S. Cl. .................. 257/686; 257/777; 257/698
(58) Field of Classification Search .................. 257/686, 257/698, 777, 723, 724
See application file for complete search history.

(56) References Cited

U.S. PATENT DOCUMENTS

| | | | |
|---|---|---|---|
| 4,437,718 A | 3/1984 | Selinko | |
| 4,959,706 A | 9/1990 | Cusack et al. | |
| 5,008,734 A * | 4/1991 | Dutta et al. | 257/693 |
| 5,235,209 A * | 8/1993 | Shimizu et al. | 257/692 |
| 5,235,211 A * | 8/1993 | Hamburgen | 257/758 |
| 5,399,898 A | 3/1995 | Rostoker | |
| 5,468,999 A * | 11/1995 | Lin et al. | 257/784 |
| 5,490,324 A | 2/1996 | Newman | |
| 5,497,027 A | 3/1996 | Crafts | |
| 5,557,502 A * | 9/1996 | Banerjee et al. | 361/712 |
| 5,608,261 A * | 3/1997 | Bhattacharyya et al. | 257/700 |
| 5,689,091 A * | 11/1997 | Hamzehdoost et al. | 174/255 |
| 5,787,575 A * | 8/1998 | Banerjee et al. | 29/832 |
| 5,796,170 A * | 8/1998 | Marcantonio | 257/786 |
| 6,020,629 A * | 2/2000 | Farnworth et al. | 257/686 |
| 6,440,770 B1 * | 8/2002 | Banerjee et al. | 438/106 |
| 6,476,506 B1 | 11/2002 | O'Connor et al. | |
| 6,603,199 B1 | 8/2003 | Poddar | |
| 6,621,155 B1 | 9/2003 | Perino et al. | |
| 6,674,159 B1 * | 1/2004 | Peterson et al. | 257/680 |
| 7,259,450 B2 * | 8/2007 | Wood et al. | 257/685 |
| 7,977,579 B2 * | 7/2011 | Bathan et al. | 174/260 |
| 2002/0096767 A1 * | 7/2002 | Cote et al. | 257/738 |

FOREIGN PATENT DOCUMENTS

JP    57 031166 A    2/1982

OTHER PUBLICATIONS

European Search Report from corresponding EP Application No. 10187341.2, mailed Nov. 25, 2010, 3 pages.
Examination Report dated Jul. 25, 2011 for corresponding EP Application No. 10187341.2, 4 pages.
European Examination Report from corresponding EP Application No. 10187341.2, mailed Jan. 10, 2011, 4 pages.
Reply to communication from the Examining Division, for EP Application No. 10187341.2, dated Jul. 8, 2011, 13 pages.
U.S. Appl. No. 12/455,574, entitled "Integrated Circuit Package Including a Thermally and Electrically Conductive Package Lid," filed Jun. 3, 2009.

* cited by examiner

*Primary Examiner* — Sheila V Clark
(74) *Attorney, Agent, or Firm* — Shumaker & Sieffert, P.A.

(57) ABSTRACT

An integrated circuit package base includes a plurality of tiers. In some examples, an integrated circuit package encloses a plurality of stacked integrated circuits that are each electrically coupled to an electrical contact located on a respective tier of the package base. The tiers of the integrated circuit package can have different elevations relative to a bottom surface of the integrated circuit package.

20 Claims, 6 Drawing Sheets

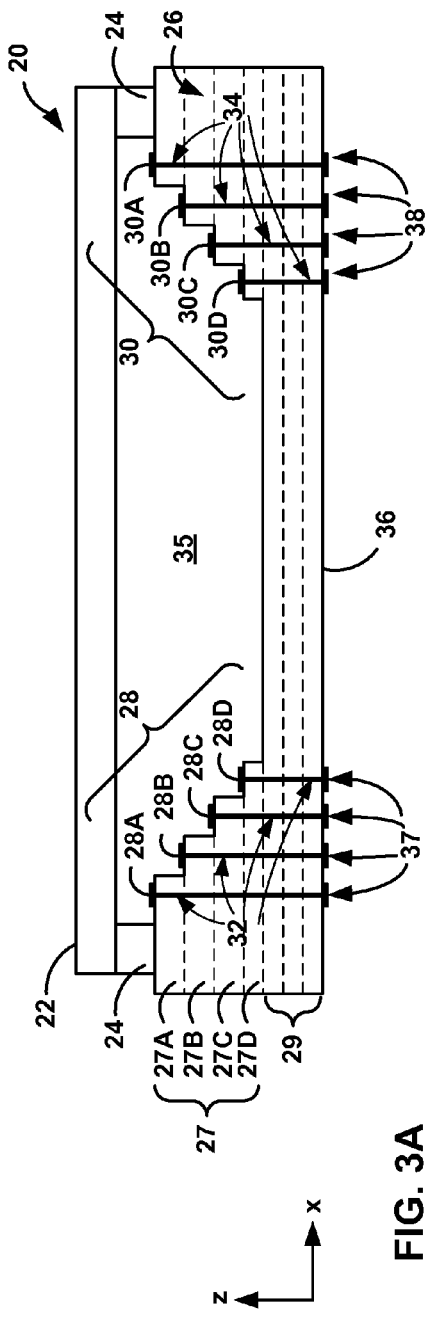
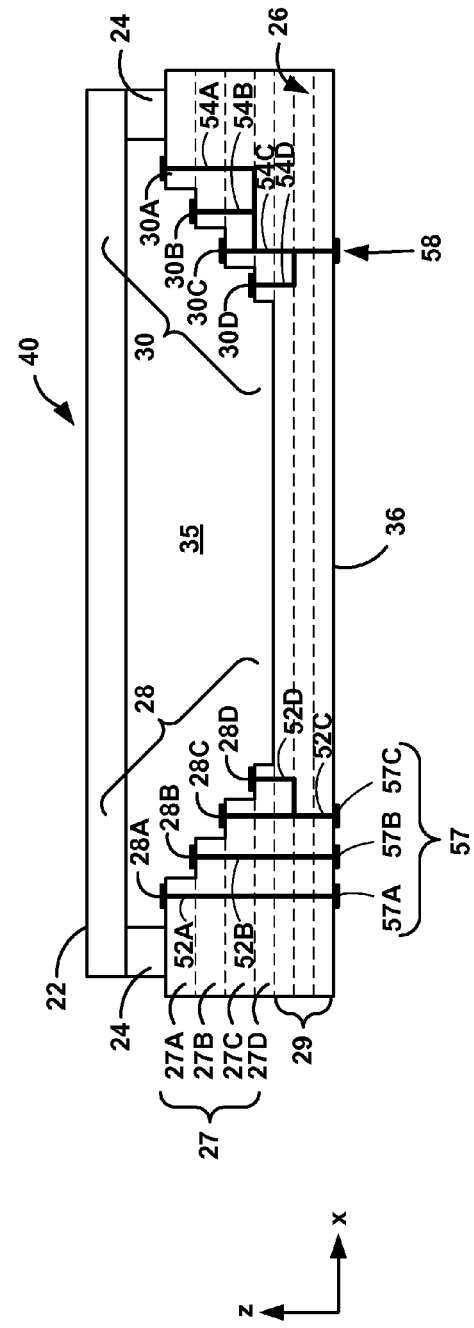
FIG. 3A
FIG. 3B

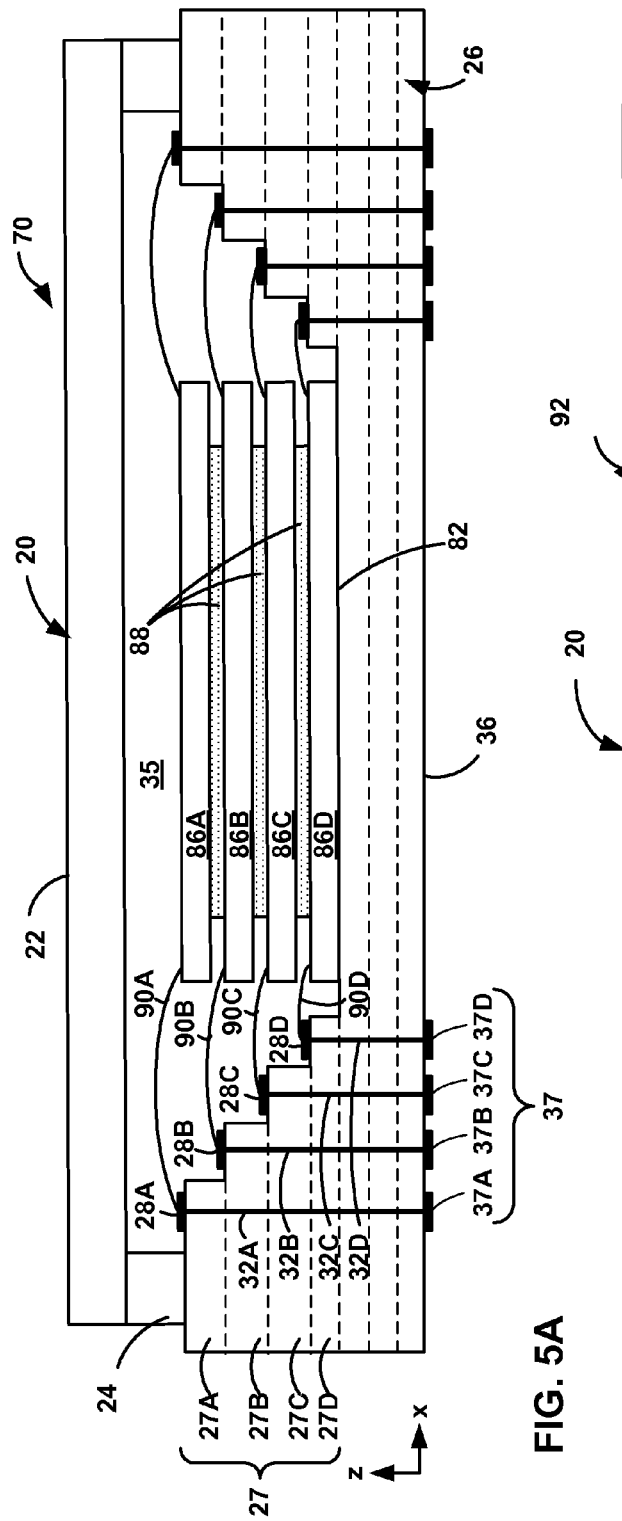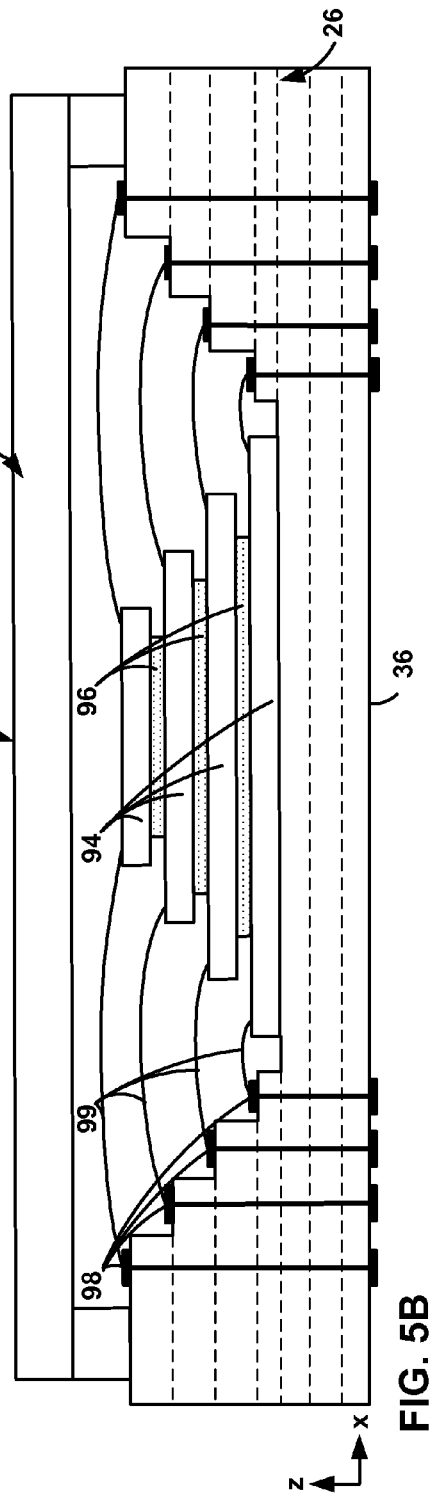
FIG. 5A
FIG. 5B

MULTI-TIERED INTEGRATED CIRCUIT PACKAGE

STATEMENT REGARDING FEDERALLY SPONSORED RESEARCH OR DEVELOPMENT

This invention was made with Government support under DTRA01-03-D-0018-0009 awarded by the Defense Threat Reduction Agency (DTRA). The Government has certain rights in the invention.

TECHNICAL FIELD

This disclosure is related to integrated circuit packaging.

BACKGROUND

An integrated circuit can be enclosed within a package, which can be, for example, mounted to a circuit board. Some integrated circuit packages include a package lid and a package base. The package base and package lid can substantially enclose one or more integrated circuits. In addition, in some cases, a seal ring is positioned between the package lid and the package base.

SUMMARY

The disclosure is directed to an integrated circuit package including a plurality of tiers. The integrated circuit package can enclose a plurality of stacked integrated circuits that are each electrically coupled to an electrical contact of a respective tier of the package. The disclosure is also directed to techniques for forming the integrated circuit package including a plurality of tiers and electrically coupling a plurality of stacked integrated circuits to respective tiers.

In one aspect, the disclosure is directed to a system that includes a package base that includes a plurality of tiers, where the plurality of tiers includes a first tier and a second tier. The system also includes a plurality of electrical contacts, where the plurality of electrical contacts includes a first electrical contact on the first tier and a second electrical contact on the second tier. The system further includes a plurality of integrated circuits, where the plurality of integrated circuits includes a first integrated circuit electrically coupled to the first electrical contact and a second integrated circuit electrically coupled to the second electrical contact. In some examples, the plurality of tiers further comprises a third tier and a fourth tier, wherein the plurality of electrical contacts further comprises a third electrical contact on the third tier and a fourth electrical contact on the fourth tier, and wherein the plurality of integrated circuits further comprises a third integrated circuit electrically coupled to the third electrical contact and a fourth integrated circuit electrically coupled to the fourth electrical contact.

In another aspect, the disclosure is directed to a method including forming a package base that includes a plurality of tiers, where the plurality of tiers includes a first tier that includes a first electrical contact and a second tier that includes a second electrical contact. The method further includes coupling a first integrated circuit to the first electrical contact and coupling a second integrated circuit to the second electrical contact.

In another aspect, the disclosure is directed to a system that includes a package base comprising a plurality of tiers including a first tier and a second tier. The system further includes a plurality of electrical contacts on the plurality of tiers, where the plurality of electrical contacts includes a first electrical contact on the first tier and a second electrical contact on the second tier, and a plurality of vias, where at least one of the plurality of vias is configured to electrically couple the first electrical contact to the second electrical contact.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIG. 3A is a schematic cross-sectional illustration of an example IC package including a multi-tiered package base with electrical contacts and vias extending through the package base.

FIG. 3B is a schematic cross-sectional illustration of an example IC package including a multi-tiered package base with electrical contacts and vias connecting electrical contacts on a first tier to electrical contacts on a second tier.

FIG. 5A is a schematic cross-sectional illustration of an IC package assembly including multiple stacked ICs of the substantially the same size coupled to electrical contacts of an example multi-tiered IC package.

FIG. 5B is a schematic cross-sectional diagram illustration of an IC package assembly including stacked ICs of varying size coupled to electrical contacts of an example multi-tiered IC package.

DETAILED DESCRIPTION

In some integrated circuit (IC) packages, integrated circuits (ICs) may be vertically stacked in order to increase the density or number of ICs in a package. Each stacked IC is electrically coupled to the package via at least one respective wire. Typically, each IC is electrically coupled to the package via a plurality of wires that provide an electrical connection between a respective electrical contact on the IC and an electrical contact on the IC package base. In some IC packages, the package base defines a planar surface on which the stack of ICs is positioned, and wires connect each IC to contacts on the planar surface of the package base in order to supply each IC with power and a signal connection. Because the stack of ICs includes multiple ICs, this configuration of wire connecting ICs to contacts on the planar surface of the package base may require the use of relatively long wires to connect the ICs on the upper levels of the stack to the planar surface of the package base. Additionally, the extension of the wires to a common location, e.g., the planar surface of the package base, may result in the crowding of wires within the package base.

Electrical resistance and inductance values of electrically conductive wires may increase as the respective length of the wires increases. As a result, relatively long wires electrically connecting ICs to the package base may decrease the electrical performance or signal integrity of the IC system. Furthermore, long wires may be more flexible than shorter wires and thus may increase the chance of an undesirable connection between two wires, which may create an electrical short circuit.

An integrated circuit package described herein includes a package base that includes a plurality of tiers to which ICs can be electrically connected. As described in further detail below, the plurality of tiers are arranged such that the wires that electrically connect each IC of a plurality of stacked ICs to the IC package base have a shorter length compared to the arrangement in which a package base defines a planar surface to which all the ICs of a stack of ICs are electrically connected. This decreases the electrical resistance and inductance values of the wires, which increases the electrical performance of the IC package system relative to the IC package bases having a single tier to which the ICs are electrically connected. Moreover, an IC package base including a plurality of tiers that each electrically connect to a respective IC helps separate the wires from each other, which helps reduce the possibility of wires electrically connecting to each other, either through a direct electrical connection or through electromagnetic coupling.

Figure 1:
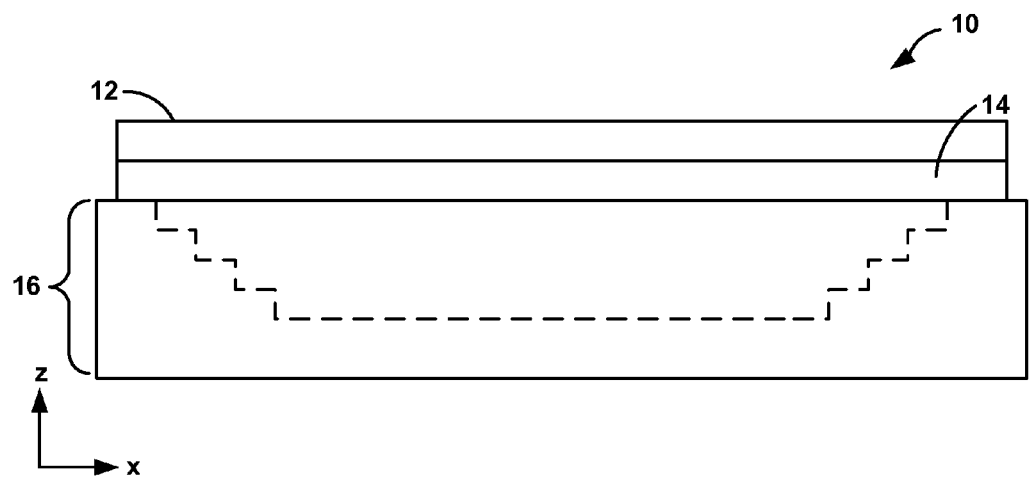
FIG. 1 is a diagram illustrating a schematic side view of an example integrated circuit (IC) package including a package base, a package lid, and a seal ring.

FIG. 1 illustrates a side view of an example integrated circuit (IC) package 10. In the example shown in FIG. 1, IC package 10 includes a package lid 12, a seal ring 14, and a multi-tiered package base 16. Package base 16 defines a cavity (shown in FIGS. 3A and 3B) for housing multiple stacked ICs. When assembled, package lid 12 covers the cavity to substantially enclose the stacked ICs within the cavity. Seal ring 14 is positioned between package lid 12 and package base 16, and creates a seal between package lid 12 and package base 16 in order to protect the stacked ICs housed within IC package 10 from the external environment. Additionally, seal ring 14 may prevent relative motion between package lid 12 and package base 16. For example, seal ring 14 can bond package base 16 and package lid 12. In some examples (not shown in FIG. 1), the cavity defined by package base 16 has an inner perimeter that is separated from an outer perimeter of package lid 12, and seal ring 14 fills the space between the inner perimeter of the cavity and the outer perimeter of package lid 12. As shown in FIG. 1, package lid 12 and seal ring 14 are of substantially the same size. In other examples, package lid 12 and seal ring 14 may be of different sizes. For example, in the case of a welded package lid, package lid 12 can be smaller than seal ring 14.

Package lid 12 can be any suitable type of package lid. As shown in FIG. 1, package lid 12 is a single-tier structure that is formed of any material suitable for enclosing stacked ICs within IC package 10. For example, package lid 12 may include a variety of substantially electrically insulating ceramic materials. Example materials for package lid 12 include, but are not limited to, aluminum oxide, aluminum nitride (AlN), beryllium oxide (BeO), and silicon carbide (SiC).

In other examples, package lid 12 comprises an electrically conductive material, such as, for example, aluminum silicon carbide (AlSiC), copper tungsten (CuW), copper molybdenum (CuMo), a nickel cobalt ferrous alloy (e.g., an alloy provided under the trademark Kovar®, made available by Carpenter Technology Corporation of Reading Pa.), or the like, as described in commonly assigned U.S. patent application Ser. No. 12/455,574 by Ronald J. Jensen et al., which is entitled, "INTEGRATED CIRCUIT PACKAGE INCLUDING A THERMALLY AND ELECTRICALLY CONDUCTIVE PACKAGE LID," and was filed on Jun. 3, 2009. U.S. patent application Ser. No. 12/455,574 by Ronald J. Jensen et al. is incorporated herein by reference in its entirety. As described in further detail in U.S. patent application Ser. No. 12/455,574, in examples in which package lid 12 comprises an electrically conductive material, package lid 12 can provide an input or output connection for electrical power, electrical signals or an electrical ground for one or more ICs in addition to similar connections provided by package base 16.

In some examples, package lid 12 may also include materials that are thermally conductive. In some examples, package lid 12 may be a multi-tier structure in which each tier may include one or more of a variety of materials. In addition, in some examples, package lid 12 can comprise a lid mesa that extends in a z-axis direction (orthogonal x-z axes are shown in FIG. 1 for purpose of illustration) towards a surface of an integrated circuit enclosed within package base 16. Additionally, in some examples, package lid 12 includes a material with a coefficient of thermal expansion (CTE) that is similar to the CTE of one or more of the materials that form package base 16.

As shown in FIG. 1, seal ring 14 is a single-tier structure that may include any material suitable for forming a seal between package lid 12 and package base 16. For example, seal ring 14 may include an alloy, such as a nickel-cobalt ferrous alloy (e.g., an alloy provided under the trademark Kovar®, made available by Carpenter Technology Corporation of Reading Pa.). A sealing material, such as gold-tin (AuSn), gold-germanium (AuGe), tin-lead (SnPb), a metal filled glass, or a lead free solder, can also be used with or without seal ring 14. In other examples, seal ring 14 may include a polymeric adhesive. Seal ring 14 may be substantially electrically insulating or, alternatively, may include a material that is substantially electrically or thermally conductive. In some examples, seal ring 14 may seal package lid 12 to package base 16 to form a hermetic package. Alternatively, a near-hermetic or non-hermetic package may be defined by seal ring 14. In some examples, components within IC package 10 may be partially or entirely encapsulated in a material such as epoxy. In some examples in which IC package 10 is encapsulated, IC package 10 may not include package lid 12 or seal ring 14.

As shown in FIG. 1, package base 16 is a multi-tier structure that includes a plurality of tiers, represented by the phantom lines shown within package base 16, of an electrically insulating substrate, such as a ceramic material. Example materials that package base 16 can comprise include, but are not limited to, any one or more of alumina ceramic, aluminum nitride (AlN), beryllium oxide (BeO), and silicon carbide (SiC). In some examples, ceramic materials that may be used to form package base 16 may have a relative dielectric constant within a range of approximately 8.5 to approximately 9.8. In addition, in some examples, ceramic materials that may be used to form package base 16 may have a thermal conductivity within a range of about 18 to about 150 Watts per meter-kelvin (W/mK). Additionally, some example ceramic materials that may be used to form package base 16 may have particular mechanical properties, such as a flexural strength of about 400 megaPascals (MPa) and a Young's Modulus within a range of about 270 to about 320 gigaPascals (GPa). Other types of ceramic materials are contemplated.

Alternatively or additionally, package base 16 may comprise a polymeric material, such as a polytetrafluoroethylene (PTFE)/ceramic based laminate (e.g., Rogers RO2800 laminate, which is made commercially available by Rogers Corporation of Rogers, Conn.) or fluoropolymer materials (e.g., fluoropolymers made commercially available by W. L. Gore and Associates of Newark, Del.), FR-4, BT-Epoxy, or polyimide. In some examples, package base 16 can be formed using multilayer co-fired ceramic packaging technology or multilayer laminate organic packaging technology. Package base 16 may thus include multiple substrate layers, e.g., seven substrate layers as shown in FIG. 3A. In other examples, package base 16 may comprise more or fewer substrate layers.

Figure 2:
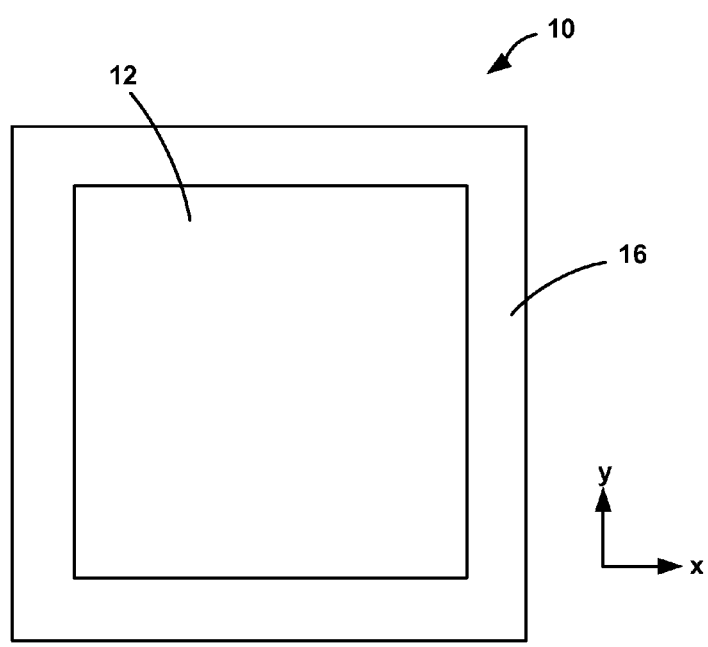
FIG. 2 is a diagram illustrating a top view of an example IC package including a package lid and a package base.

FIG. 2 illustrates a top view of the IC package 10. As shown in FIG. 2, package lid 12 is positioned on the topmost portion of IC package 10. Package base 16 is visible around the outer perimeter of package lid 12. As illustrated in FIGS. 1 and 2, seal ring 14 (FIG. 1) is of the same width and length as package lid 12 and thus is not visible in the top view of FIG. 2. However, in other examples, seal ring 14 may be of a greater or smaller width than package lid 12. In the example of FIG. 2, IC package 10 has a square configuration. In other examples, IC package 10 may be substantially more rectangular or may have a substantially more curvilinear outer perimeter.

FIGS. 3A and 3B illustrate schematic cross-sectional diagrams of example IC packages, where the cross-section is taken along an x-z plane (orthogonal x-z axes are shown in FIG. 3A for purposes of aiding the description only). IC package 20, shown in FIG. 3A, includes package lid 22, seal ring 24, package base 26, tiers 27A-27D (collectively "tiers 27"), electrical contacts 28A-28D (collectively "electrical contacts 28") and 30A-30D (collectively "electrical contacts 30"), electrically conductive vias 32 and 34, and electrical contacts 37 and 38. Package lid 22 may be substantially similar to package lid 12 (FIGS. 1 and 2) and seal ring 24 may be substantially similar to seal ring 14 (FIG. 1).

Tiers 27 of package base 26 define a side wall structure. Because of the sidewall structure defined by tiers 27, the height of seal ring 24 of IC package 20 may be relatively small compared to a conventional IC package that includes a package base that encloses ICs that are electrically coupled to a planar surface of the package base. For example, an IC package assembly encloses ICs that are electrically coupled to a planar surface of the package base does not include a tiered structure (such as that of IC package 20). Therefore, the conventional IC package may not include a side wall structure (e.g., a wall along the y-z plane or the x-y plane), or may include a side wall structure of smaller dimensions than the side wall structure provided by tiers 27 of IC package 20 as measured in the z-axis direction. The distance as measured in the z-axis direction between the package lid and the package base may be much greater in an IC package assembly with a planar surface on the package base, thus requiring a taller seal ring and/or additional layers within the package base 16 to create a seal between the package lid and the package base. Because top tier 27A (whereby "top" refers to the tier having the greatest z-axis position) is located relatively close to package lid 22, IC package 20 may require a smaller seal ring 24 relative to an IC package assembly that does not include multi-tiered package base 26. Consequently, IC package 20 may require a smaller amount of material to form seal ring 24 relative to an IC package assembly that does not include multi-tiered package base 26.

As shown in FIG. 3A, package base 26 includes a multi-tiered structure defined by a plurality of tiers 27. Each of the tiers 27 has a different z-axis elevation relative to bottom surface 36 of package base 26. Tiers 27 each define a different surface and, due to the different z-axis elevations of tiers 27, the different surfaces defined by the tiers 27 are spaced respective distances from bottom surface 36 of package base 26. In addition, in the example shown in FIG. 3A, tiers 27 are sized such that various steps are defined within cavity 35. In the example shown in FIG. 3A, tiers 27 are sized such that each successive tier in the negative z-axis direction extends further into cavity 35. As a result, each tier 27 having a different elevation relative to bottom layer 29 of IC package base 26 has a different dimension in the x-y plane, where the dimension is measured between an exterior of package base 24 (e.g., a side surface of package base 24 extending substantially along the x-z or y-z plane) and a center of cavity 35. Tiers 27 at the lower elevation (closest to bottom layer 29) have the greatest dimension in the x-y plane, and tiers 27 at a higher elevation (further from bottom layer 29 than the lower tiers) have the smallest dimension in the x-y plane. In other examples, tiers 27 can have other configurations. For example, tiers 27 can be sized such that each successive tier in the positive z-axis direction extends into cavity 35 by a greater amount.

In some examples, tiers 27 can have substantially similar thicknesses (measured in a direction substantially perpendicular), while in other examples, at least two tiers 27 have different thicknesses. The thickness of each tier 27 can be selected based on various factors, such as the number of types of electrically conductive vias 32, 34 extending through the respective tier 27, the number of electrical contacts 28, 30 on the respective tier 27, the arrangement of ICs disposed within cavity 35 (e.g., the thickness of each of the tiers 27 can be used to control the elevation of the tier 27 relative to bottom surface 36 of IC package 26), and the like. In some examples, the thickness of each respective tier 27 may be approximately the same as the thickness of the combination of the separation layer and the IC positioned at the same height as the respective tier 27 (e.g., as illustrated in FIGS. 5A, 5B, 7A, and 7B). In some examples, the thickness of each tier 27 can be selected to facilitate the best shape or configuration of the wires, e.g., wires 90 in FIG. 5A, that electrically connect each IC to its respective tier 27. For example, selecting a thicker tier 27 may create a greater distance between two wires, preventing transmission of signal noise through electromagnetic coupling or interference.

Package base 26, together with the side structure defined by tiers 27, defines a cavity 35 in which a plurality of ICs or another type of substrate can be enclosed. As discussed above, when assembled, package lid 22 substantially covers cavity 35 to substantially enclose the ICs in cavity 35. As shown in FIG. 3A, package base 26 comprises seven substrate layers. In other examples, package base 26 may comprise a fewer or greater number of substrate layers. The number of substrate layers can depend on various considerations, such as the type of substrate used to define package base 26, the number of ICs enclosed within cavity 35 of package base 26, the height of the ICs and the spacer layers that separate the stacked ICs, and the like. Package base 26 includes tiers 27, each of which is contained within a respective substrate layer, and bottom layers 29, which form a platform onto which stacked ICs (not shown) may be placed. In other examples, however, tiers 27 may not correspond to a respective substrate layer. For example, a plurality of substrate layers (e.g., two or more) can define a single tier.

Tiers 27 are of varying heights (relative to bottom surface 36 of package base 26, whereby height is in a substantially z-axis direction) and define different levels of package base 26 to which stacked ICs arranged at varying heights may be electrically coupled. That is, when a plurality of ICs are stacked in a z-axis direction to define an IC stack, at least two of the ICs are positioned at different heights (or elevations) relative to bottom surface 36 of package base 26. In some examples, each IC of an IC stack disposed in cavity 35 electrically connects to an electrical contact of a respective tier 27. In other examples, each IC of an IC stack disposed in cavity 35 electrically connects to electrical contacts of at least two different tiers 27. In addition, the ICs of an IC stack can electrically connect to electrical contacts of a common or of separate tiers. Moreover, in some examples, tiers 27 are configured such that each IC of an IC stack disposed in cavity 35 corresponds to and electrically connects to an electrical contact on a tier 27 having a substantially similar z-axis position. However, the exact z-axis distribution of tiers 27 and the ICs of an IC stack need not be achieved in every example.

In the example shown in FIG. 3A, electrical contacts 28 and 30 are positioned on the surface of tiers 27. In some examples, electrical contacts 28 and 30 can each be defined by at least one of an electrically conductive pin, pad, solder material, or lead that is separate from electrically conductive vias 32, 34 extending though package base 26, e.g., between substrate layers. Electrical contacts 28 and 30 may be defined using any suitable technique. In one example, electrical contacts 28, 30 are formed by applying a thin layer of conductive material to the surface of one or more of tiers 27, e.g., by electroplating or electroless plating techniques. The thin layer of conductive material can be added as a finish metal over an electrically conductive pad that is in contact with the conductive material (e.g., tungsten) that forms vias 32, 34. For example, in some examples, electrical contacts 28 and 30 may be formed by applying a thin layer of nickel material covered by a thin layer of gold material. In other examples, electrical contacts 28 and 30 may be formed by applying only one type of conductive material, e.g., only nickel or only gold, or more than two types of conductive materials. Other conductive materials, such as tin, may alternatively or additionally be used to form electrical contacts 28 and 30. Electrical contacts 28, 30 can have a different dimension along the surface of tier 27 than the respective conductive vias 32, 34. For example, electrical contacts 28, 30 can increase the conductive surface area compared to the surface area defined by conductive vias 32, 34 at the interface with the respective electrical contact 28, 30.

In some examples, bottom layers 29 of package base 26 can also include electrical contacts for electrical coupling to one or more of the stacked ICs in addition to tiers 27. Any suitable type of plating technique can be used to define electrical contacts 28, 30, such as electroplating or electroless plating techniques. In addition, electrical contacts 28, 30 can have any suitable thickness (as measured in a z-axis direction), such as about 1.5 microns to about 2.5 microns, although other thicknesses are contemplated. As shown in FIG. 3A, electrical contacts 28A and 30A are positioned on a surface of tier 27A on opposite sides of package base 26. Similarly, electrical contacts 28B and 30B are positioned on a surface of tier 27B, electrical contacts 28C and 30C are positioned on a surface of tier 27C, and electrical contacts 28D and 30D are positioned on a surface of tier 27D.

In other examples, rather than being disposed on a top surface of tiers 27, electrical contacts 28 and 30 may be at least partially embedded within tiers 27 (e.g., partially or fully surrounded on at least two sides or at least three sides by the insulating material of package base 26). For example, electrical contacts 28 and 30 can be defined by electrically conductive material that is introduced into openings formed in package base 26 and placed in electrical contact with a respective via 32, 34. The electrically conductive material defining electrical contacts 28, 30 can be, for example, the same as or different than the material defining electrically conductive vias 32, 34. In addition, as with the surface electrical contacts 28, 30, the electrical contacts that are at least partially embedded within tiers 27 can have the same or different dimension along x-y plane than the respective conductive vias 32, 34.

Electrical contacts 28 and 30 may include one or more electrically conductive materials (e.g., copper, silver, gold, or nickel) suitable for electrical coupling to stacked ICs. Vias 32, 34 also comprise an electrically conductive material (e.g., tungsten, molybdenum, copper, silver, or gold), which may or may not be the same electrically conductive material from which electrical contacts 28, 30 are formed.

Figure 7A:
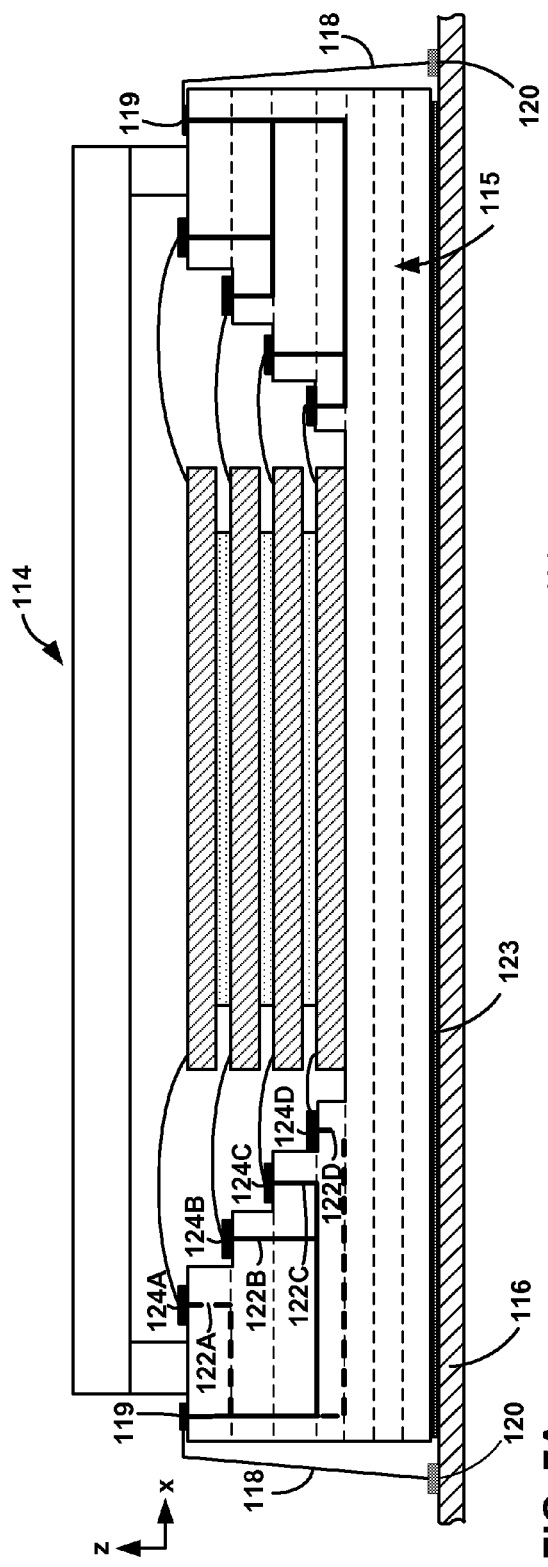
FIG. 7A is a schematic cross-sectional diagram of an IC package assembly that is electrically coupled to a printed wiring board (PWB) via electrical leads.

In the example of IC package 20 shown in FIG. 3A, each of vias 32 and 34 defines an electrically conductive pathway between one of electrical contacts 28 and 30 and a respective electrical contact 37 or 38 that is positioned on bottom surface 36 of package base 26. Electrical contacts 37, 38 can, for example, be used to electrically connect one or more ICs enclosed within cavity 35 to a printed wiring board (PWB) or another member using any suitable connection technique, such as using conductive pins, solder balls, solder columns, package leads (e.g., electrical leads), and the like. In examples in which electrical leads are used to electrically connect IC package 20 to a PWB or another member, electrical contacts 37, 38 of IC package 20 may not be positioned on the bottom surface of package base 26. For example, electrically conductive vias 32, 34 can terminate and be exposed at or be electrically connected to electrical contacts that are along a side surface of package base 26 (e.g., along the x-z or y-z plane as shown in FIG. 7A), at a top surface of package base 26 (e.g., the surface furthest from the PWB), and/or on lid 12.

Electrical contacts 37, 38 can each be defined by at least one of an electrically conductive pin, pad, solder material, or lead that is separate from vias 32, 34 extending though package base 26. In some examples, electrical contacts 37 and 38 are each formed by applying a thin layer of conductive material to the bottom surface 36 of package base 26, e.g., by plating, where the conductive material is positioned to be in electrical contact with a respective via 32, 34. In some examples, the thin layer of conductive material is added as a finish metal over the conductive material that forms vias 32, 34, or an electrically conductive pad can be positioned between the finish metal and vias 32, 34. Any suitable type of plating technique can be used to define electrical contacts 28, 30, such as electroplating or electroless-plating techniques. In addition, electrical contacts 28, 30 can have any suitable thickness (as measured in a z-axis direction).

In other examples, rather than being positioned on bottom surface 36 of IC package 26, electrical contacts 37 and 38 may be at least embedded within layers 29 on bottom surface 36 (e.g., at least partially surrounded on at least two sides or at least three sides by the insulating material of package base 26). For example, electrical contacts 37 and 38 can be defined by electrically conductive material that is introduced into openings formed along bottom surface 36 of package base 26, where the electrically conductive material can be, for example, the same as or different than the material defining electrically conductive vias 32, 34.

FIG. 3B is a schematic illustration of another example IC package 40. IC package 40 is substantially similar to package 20 shown in FIG. 3A, but includes a plurality of electrically conductive vias 52A-52D (collectively referred to as "vias 52), electrically conductive vias 54A-54D (collectively referred to as "vias 54"), at least two of which are electrically connected to each other. In this way, at least some of electrical contacts 28, 30 are electrically connected to each other by way of electrically conductive vias 52, 54. Some of the vias 52, 54, however, are electrically isolated from each other, e.g., via electrically insulating material defining package 26.

As with vias 32, 34 discussed above with respect to FIG. 3A, vias 52, 54 define electrically conductive pathways between electrical contacts 28 and 30, respectively, and electrical contacts 57 and 58 on bottom surface 36 of IC package 26. For example, in the example shown in FIG. 3B, via 52A forms an electrically conductive pathway between electrical contact 28A and electrical contact 57A and via 52B forms an electrical pathway between electrical contact 28B and electrical contact 57B. In contrast, via 52D forms an electrical pathway between electrical contact 28D and via 52C, and, consequently, forms an electrical pathway between electrical contacts 28C and 28D. Electrically conductive vias 52, 54 that are electrically connected to each other may be useful for providing an connection between a plurality of ICs within cavity 35 of base 26 and a common power source or ground. In some examples, electrically connecting electrical contacts 28C, 28D is useful for electrically connecting two or more ICs that are electrically connected to only one of the electrical contacts 28C, 28D. Rather than routing wires within cavity 35 of package 26 to electrically connect the two or more ICs, internal electrical connections can be formed within package 26, thereby simplifying IC package 40 and reducing the congestion of wires disposed within cavity 35. In other examples, electrically connecting electrical contacts 28C, 28D can be useful for providing common signals to two or more ICs that are electrically connected to a respective one of the electrical contacts 28C, 28D. In addition, electrically connecting electrical contacts 28C, 28D to each other can be useful in some cases to, for example, electrically connect contacts 28C, 28D (and any ICs electrically connected thereto) to a common ground or power source.

Via 52C also defines an electrical pathway to electrical contact 56C of package 26, and, thus, forms an electrical pathway between electrical contacts 28C and 28D and electrical contact 57C. Similarly, via 54D forms an electrical pathway between electrical contact 30D and via 54C. Vias 54A and 54B also define electrical pathways to electrical contact 30C, and via 54C defines an electrical pathway to electrical contact 58. Thus, in the example shown in FIG. 3B, electrical contacts 30 are electrically connected to one another and to electrical contact 58 on the bottom surface of package base 26. Electrically connecting electrical contacts 30 to each other can be useful in some cases to, for example, electrically connect contacts 30 (and any ICs electrically connected thereto) to a common ground, power source or signal connection.

Moreover, electrically connecting electrical contacts 30 to each other can be useful in some cases to, for example, electrically connect two or more ICs that are electrically connected to only one of the electrical contacts 30. Rather than routing wires within cavity 35 of package 26 to electrically connect the two or more ICs, internal electrical connections can be formed within package 26, thereby simplifying IC package 40 and reducing the congestion of wires disposed within cavity 35.

In other examples, vias 52 and 54 may have configurations that differ from those shown in FIG. 3B. As an example, at least some of vias 52 and 54 can be electrically isolated from electrical contacts 57 and 58 in some examples of IC package 40. For example, some of vias 52 and 54 may not be electrically connected to electrical contacts 56 and 58. As a result, some of vias 52 and 54 may not be configured to electrically connect to a printed wiring board or another device through electrical contacts 57 and 58 on bottom surface 36 of package base 26. As another example of a different configuration of vias 52, 54, one or more tiers 27 may not include an electrical contact or may not include an electrical contact on all sides of one or more tiers 27, and, thus, may not have a corresponding via 52 or 54. The configuration of electrical contacts 28, 30 of the tiers 47 and the electrical pathways formed by the vias 52 and 54 may vary based on a desired electrical connection arrangement between the stacked ICs disposed within cavity 35. Additionally, the amount and configuration of electrical contacts 57 and 58 may vary based on the configuration of vias 52, 54 that form electrical pathways to bottom surface 36 of package base 26.

In each of the IC packages described herein, electrical contacts on each of the tiers and on the bottom surface of the multi-tiered package base can be distributed around one or two or more sides of the package base. For example, if a package base (e.g., package base 26 shown in FIG. 3A) has a substantially quadrilateral shape in a cross-section taken along the x-y plane (e.g., orthogonal x-y-z axes are shown in FIGS. 1-3B), for each of the tiers of the package base, the electrical contacts exposed within the cavity (e.g., cavity 35 shown in FIG. 3A) and positioned on the bottom surface of the package base can be distributed around one, two, three or four sides of the package base.

Figure 4:
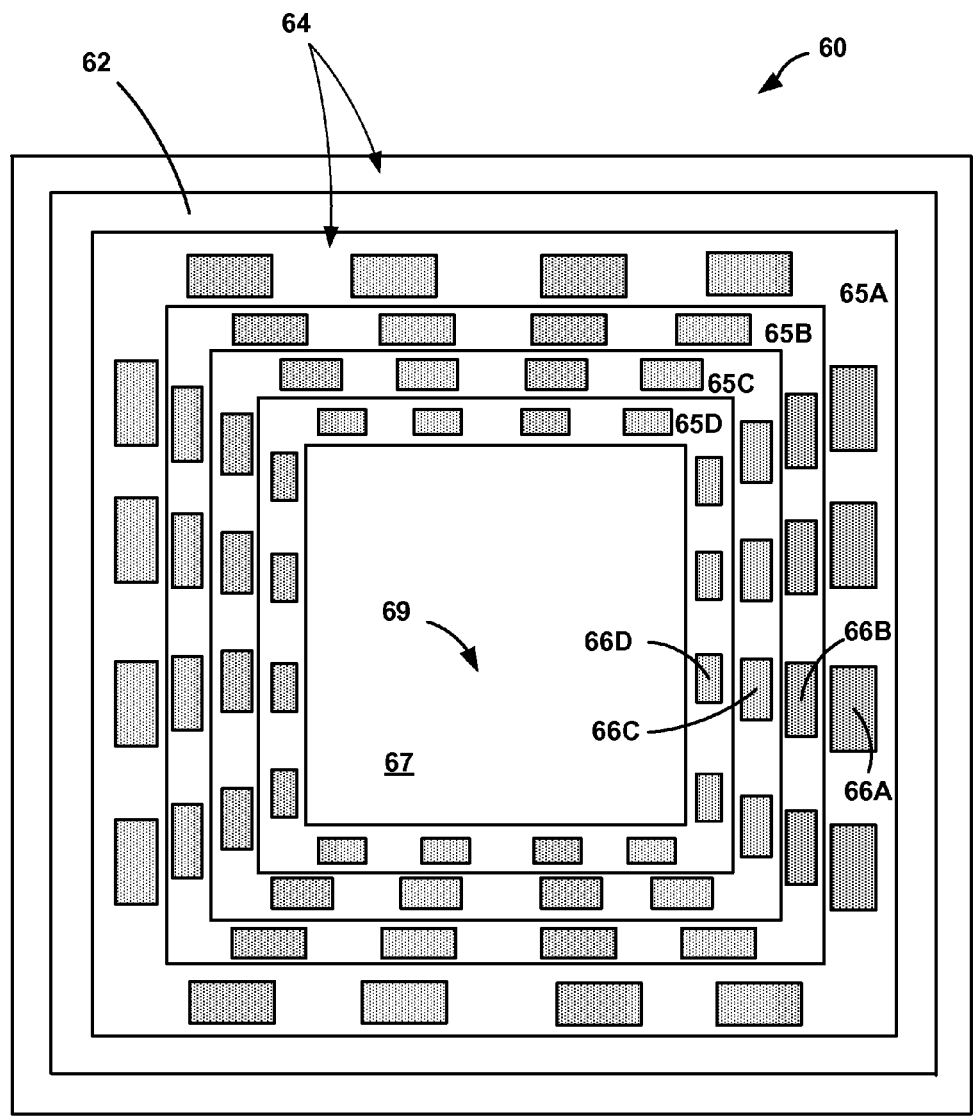
FIG. 4 is a schematic illustration of a top view of an example IC package with a package lid removed, including a multi-tiered package base with electrical contacts on each of the multiple tiers of the package base.

An example distribution of electrical contacts is shown in FIG. 4, which is a top view of an example IC package 60 with the package lid removed. IC package 60 includes seal ring 62, package base 64, and sets of electrical contacts 66A-66D (collectively "electrical contacts 66"). Seal ring 62 may be substantially similar to seal ring 14 described above with respect to FIGS. 1 and 2.

Package base 64 defines cavity 69 within which a plurality of integrated circuits (e.g., integrated circuits stacked in a z-axis direction) can be introduced. As shown in FIG. 4, package base 64 includes a plurality of tiers 65A-65D (collectively "tiers 65") that define a stepped arrangement within cavity 69. Tier 65A is the topmost tier of package base 64, e.g., has the greatest elevation (as determined in a substantially z-axis direction, where orthogonal x-y axes are shown in FIG. 4) relative to bottom layer 67 of package base 64. Tier 65A may be substantially similar to tier 27A of IC package 20 shown in FIG. 3A. Tier 65D is the bottommost tier of package base 64 relative to bottom layer 67 of IC package base 64, e.g., has the lowest elevation (as determined in a substantially z-axis direction, where orthogonal x-y axes are shown in FIG. 4) relative to bottom layer 67 of package base 64. Bottom tier 65D may be substantially similar to tier 27D of IC package 20 shown in FIG. 3A. Bottom layer 67 may be substantially similar to bottom layers 29 of FIGS. 3A and 3B.

In the example shown in FIG. 4, IC package base 64 includes 64 electrical contacts of substantially the same size, including sets of electrical contacts 66A-66D (collectively "electrical contacts 66"), that are arranged on all four sides of package base 64. Tier 65A of package base 64 includes set of electrical contact 66A, tier 65B includes set of electrical contacts 66B, tier 65C includes set of electrical contacts 66C, and tier 65D include set of electrical contacts 66D. In other examples, sets of electrical contacts 66 can be positioned on a fewer number of sides of package base 64, such as about one, two or three sides of package base 64.

Each of the electrical contacts shown in FIG. 4 may be electrically coupled to another electrical contact within package base 64 by electrically conductive vias, such as vias 32, 34, 52, and/or 54 illustrated in FIGS. 3A and 3B. Alternatively or additionally, electrically conductive vias may define electrical pathways between the electrical contacts 66 and electrical contacts (e.g., electrical contacts 37, 38, 57, and 58 of FIGS. 3A and 3B), on the bottom surface of package base 64, i.e., through bottom layer 67. The electrically conductive vias may be at least partially oriented perpendicular to the plane of FIG. 4 (e.g., in a substantially z-axis direction), extending toward bottom layer 67 into package base 64 from the electrical contacts.

Each of the electrical contacts illustrated in FIG. 4 is located on a tier of package base 64 near the interior perimeter of the tier (whereby the interior perimeter is the perimeter closest to cavity 69). In other examples, each electrical contact may be located at a different point on its respective tier. For example, an electrical contact may be located substantially more centrally within its respective tier.

As discussed above, an IC package including a package base defining a plurality of tiers can enclose a plurality of ICs in a single IC package. In some examples, the ICs are stacked in a vertically stacked configuration whereby ICs are separated from each other in a direction substantially along a depth of an IC package base cavity. Each of the ICs enclosed within the IC package including a multi-tiered package base can be electrically isolated from each other (e.g., define separate circuits) or can be electrically connected to each other. For example, as described above with respect to FIG. 3B, in some examples, electrically conductive vias within an IC package base can electrically connect two or more ICs to each other or to a common ground, power source or other signal source.

FIG. 5A illustrates a schematic cross-sectional view of an example IC package assembly 70, which includes IC package 20 (also shown in FIG. 3A) and a plurality of ICs 86A-86D in a stacked configuration (collectively "stacked ICs 86"). In other examples, other types of IC packages, such as IC package 40 shown in FIG. 3B, can enclose a plurality of ICs. ICs 86A-86D are stacked in a substantially z-axis direction (orthogonal x-z axes are shown in FIG. 5A for ease of description of FIG. 5A). ICs 86 can be any suitable type of ICs, such as, but not limited to, memory chips. For example, each of ICs 86A-86D can comprise an SRAM (static random access memory) die.

In the example shown in FIG. 5A, ICs 86A-86D are at least partially electrically isolated from one another by separation layers 88. In particular, at least one separation layer 88 is arranged between adjacent ICs 86A-86D. Separation layers 88 may be formed of any suitable electrically insulative material, such as adhesive material (e.g., an electrically insulative epoxy) in order to mechanically couple each of stacked ICs 86 to one another in a stacked configuration. In other examples, at least one of the separation layers 88 can include an electrically conductive material if, for example, another mechanism is utilized to at least partially electrically isolate the ICs. Stacked ICs 86 and separation layers 88 may be coupled to form one unit before placement within package base 26 or, alternatively, may be stacked and mechanically connected to each other within package base 26.

Stacked ICs 86 are electrically coupled to respective electrical contacts 28 of tiers 27 of package base 26 via respective wires 90A-90D (collectively "wires 90"). As discussed with respect to FIG. 3A and shown in FIG. 5A, vias 32A-32D (collectively "vias 32") define an electrical pathway between electrical contacts 28 and electrical contacts 37 on bottom surface 36 of package base 26. In other examples, vias 32 may electrically couple two or more of electrical contacts 28 to one another, e.g., as shown and described with respect to vias 52 and 54 in FIG. 3B.

In the example shown in FIG. 5A, each of the stacked ICs 86 is electrically connected by a respective wire 90 to one of the electrical contacts 28 located on one of tiers 27 that is of approximately the same height (or elevation) relative to bottom surface 36 of package base 26. For example, IC 86A is located at approximately the same height (e.g., a dimension determined in a substantially z-axis direction) as tier 27A. Tier 27A includes electrical contact 28A, from which via 32A forms an electrical pathway to electrical contact 37A positioned on bottom surface 36 of package base 26. IC 86A is electrically coupled to electrical contact 28A via wire 90A and, consequently, is electrically connected to electrical contact 37A.

Wires 90 (e.g., aluminum or gold wires) can be electrically and mechanically connected to respective ICs 86 and electrical contacts 28 using any suitable technique. For example, wires 90 may be wedge bonded or ball bonded to respective ICs 86 and electrical contacts 28. In other examples, flat leads may be soldered to respective ICs 86 and electrical contacts 28.

IC package 70 may be adapted to connect to a printed wire board (PWB) (not shown in FIG. 5A) by any of a number of techniques known in the art. In some examples, vias 32 may be electrically connected to a PWB positioned beneath the bottom surface of package base 26 by electrical contacts 37. For example, electrical contacts 37 may be electrically connected to a PWB via ball grid arrays, land grid arrays, pin grid arrays, solder columns, or leadless chip carriers. Alternatively or additionally, vias 32 may be electrically connected to braze pads positioned around the perimeter of package base 26, e.g., on the top or side surfaces of package base 26, and the braze pads may be electrically connected to the PWB via leads, e.g., leads of dual or quad flat-packages.

A multi-tiered package base 26 facilitates electrical coupling of one of stacked ICs 86 to one of electrical contacts 28 on one of tiers 27. The arrangement of electrical contacts 28 of package base 26 at various heights (as measured in a substantially z-axis direction) within cavity 35 more accurately corresponds to the arrangement of ICs 86 within cavity 35 of package base 26 compared to, for example, a package base in which all the electrical contacts are on a common plane or otherwise at the same elevation relative to a bottom surface of the package base. Electrically coupling each of ICs 86 to electrical contacts 28 on a respective tier 27 that has a height that corresponds to the height of the IC 86 in the stack may permit the use of shorter wires, e.g., wires 90, than would be possible with other configurations of an IC package base that do not include tiers 27. While the ICs 86 and tiers 27 may not be arranged such that electrical contacts 28 have the same height as electrical contacts on ICs 86, ICs 86 and tiers 27 can be arranged at heights that are closer to each other compared to, for example, electrical contacts 28 that are on a common planar surface. Electrical contacts 28 on each of the respective tiers 27 are positioned to be closer to at least one IC 86 than another IC 86.

A length of each of the wires 90 can be selected based on a distance between an IC 86 and a respective electrical contact of package base 26. IC package 20 can permit the use of shorter wires compared to, for example, a package base in which all the electrical contacts are at the same elevation relative to a bottom surface of the package base because the length of wires 90 is selected to extend from an IC 86 to an electrical contact that is relatively close to the IC 86. In contrast, some wires that are used to electrically connect ICs with electrical contacts of an IC package base that includes electrical contacts arranged in a common plane, e.g., along a surface of the cavity defined by the package base, can be relatively long. For example, a wire that extends between IC 86A at the highest elevation relative to bottom surface 36 of package base 26 and an electrical contact at the bottom surface 82 of cavity 35 may be longer than a wire that extends between IC 86D at the lowest elevation relative to the bottom surface of package base 26 and an electrical contact at the bottom surface 82 of cavity 35. The use of shorter wires 90 can improve electrical characteristics of IC package assembly 70 by, for example, reducing resistance and inductance of the wires.

Additionally, electrical coupling of stacked ICs 86 to electrical contacts 28 on tiers 27 having varying heights may facilitate separation between wires 90, which may reduce the possibility of a short circuit (e.g., conductive portions of wires 90 contacting each other) or an undesirable electrical connection between two or more stacked ICs 86. Additionally, increasing the distance physically separating wires 90 helps to reduce the possibility that wires 90 will impose signal noise on each other through electromagnetic coupling or interference.

Multi-tiered IC package base 26 helps to reduce congestion of wires 90 within IC package 20, which can be useful for, for example, manufacturing IC package assembly 70. Rather than concentrating one end of wires 90 in a common plane or at another common elevation at which electrical contacts are positioned, multi-tiered package base 26 permits ends of wires 90 to be connected to electrical contacts in different planes (e.g., different planes in which each of tiers 27 are located) that are at different z-axis positions. Thus, the crowding of wires 90 within package 26 is reduced. Moreover, the reduction in length of wires 90 resulting from the multi-tiered IC package base 26 further helps reduce congestion of wires 90 within IC package 20 by reducing the length of wire that is enclosed within cavity 35 of package base 26.

Shorter wires 90 may also simplify the process of electrically coupling stacked ICs 86 to electrical contacts 28 in comparison to electrical coupling in which longer wires are required. For example, shorter wires 90 may decrease the congestion within package base 26 because less wire length is necessary to couple stacked ICs 86 to electrical contacts 28. Wires 90 connected to package base 26 are also spread out amongst different tiers, thereby resulting in less congestion, which may help increase the ease of bonding wires 90 to respective electrical contacts on package base 26. Electrical coupling in this manner may also improve the control of wire loops. For example, shorter wires 90 may prevent entanglement of the wires or drooping of the wires due to gravitational force, facilitating placement of wires 90 in a desired configuration.

Additionally, electrical coupling using shorter wires 90 between stacked ICs 86 and electrical contacts 28 may increase the maximum number of stacked ICs 86 that may be included in a package because of the increased separation of electrical contacts 28, which decreases the opportunity for short circuits between one or more wires 90 in comparison to electrical coupling to a package that does not include tiers 27. In addition, the decreased congestion of wires within cavity 35 can allow for additional ICs to be included in cavity 35.

FIG. 5B illustrates a schematic cross-sectional view of another example IC package 92 in which stacked ICs 94 are enclosed. In contrast to the stacked ICs 86 (FIG. 5A), of which each have substantially the same size, e.g., as the dimension measured in the x, y, and z-axis directions, stacked ICs 94 have different dimensions as measured in the x and y dimensions and have substantially the same dimensions as measured in the z-axis direction. Thus, ICs 94 each have different sized major surfaces (measured in the x-y plane in the example shown in FIG. 5A). In the example shown in FIG. 5B, the ICs with the largest major surfaces are located closer to bottom surface 36 of package base 26, such that ICs 94 gradually increase in size as tiers 27 of package base 26 approach bottom surface 36. In other examples, stacked ICs 94 may have different dimensions as measured in the z-axis direction and/or at least two ICs 94 can have the same dimension in the x-y plane.

Separation layers 96 between stacked ICs 94 also have different dimensions as measured in the x and y-axis directions, corresponding to the dimensions of the stacked ICs 94 between which they are positioned. In the case of stacked ICs having different dimensions, it may be even more desirable to have greater vertical separation between electrical contacts 98 and, consequently, between wires 99. Wires 99 may have an increased length when bonded to electrical contacts 98 on tiers that have a higher position in the z-axis direction, in comparison a scenario in which each of the stacked ICs has substantially the same dimensions as measured in the x and y-axis directions (FIG. 5A). Greater vertical separation between each of wires 99 may prevent undesirable contact between wires 99 that may create a short circuit.

Figure 6:
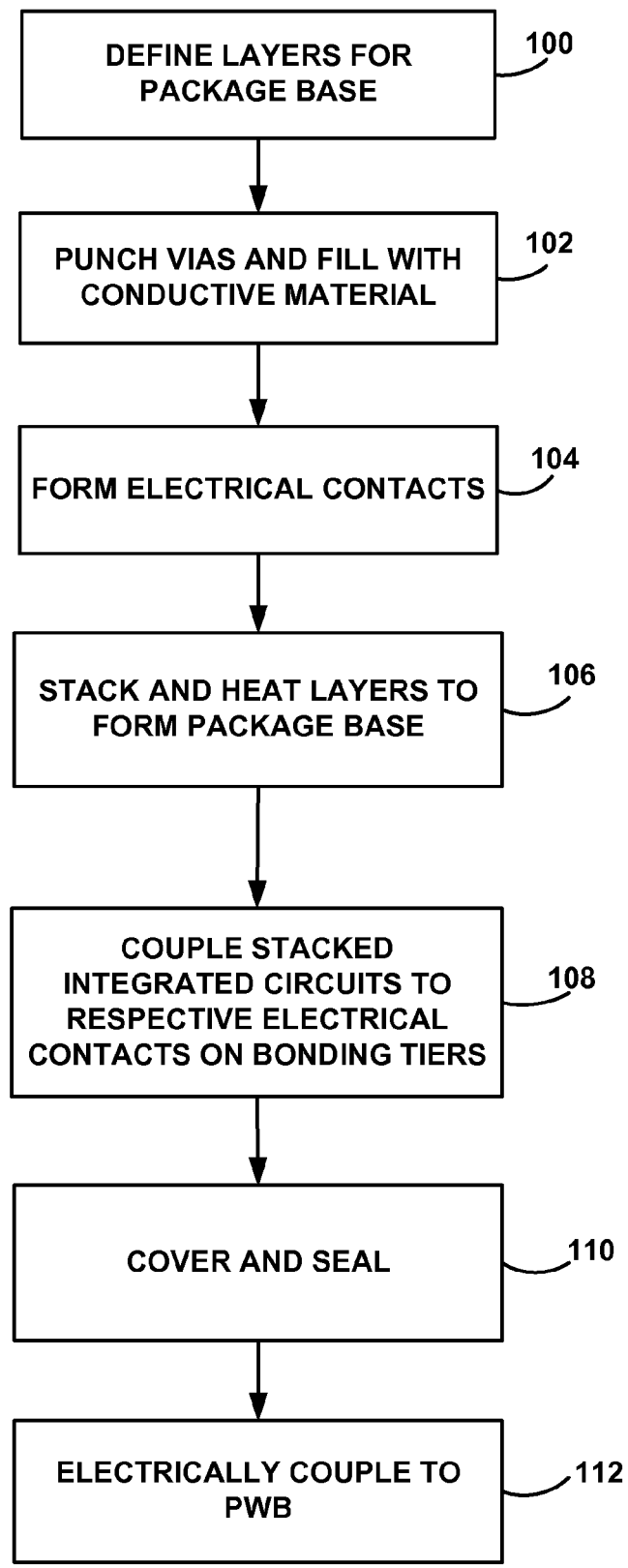
FIG. 6 is a flow diagram illustrating an example technique for forming a multi-tiered IC package.

FIG. 6 is a flow diagram illustrating an example technique for forming a multi-tiered stacked IC package. The package base, which may be similar to any package base described herein, such as package base 26 (FIG. 3A), may be fabricated from an electrically insulating substrate, such as ceramic. Sheets of the substrate material may be cut into desired dimensions for each of the bottom layers 29 and tiers 27 of multi-tiered package base 26, forming a layer of substrate material of predetermined dimensions for each bottom layer and each tier of the package base (100). Spaces within the substrate material for vias, such as electrically conductive vias 32, 34 (FIG. 3A), are formed through the layers of substrate material in a predetermined configuration. In some examples, the spaces for the vias are formed by punching through the substrate material with a sharp tool, which can be automatically controlled by a computing device or manually applied to the substrate material by a user. In other examples, the spaces for the vias may be formed by applying a laser beam in a desired configuration to the substrate layers or by drilling.

The spaces within the substrate material are then filled with a conductive material, such as a conductive paste (102). Electrical contacts of the package base, such as electrical contacts 28, 30, 37, 38 (FIG. 3A), may be separately patterned or deposited, or otherwise separately defined and electrically connected to the vias (104). Electrical contacts can be formed by punching and filling spaces in the layers of substrate material. The electrical contacts can be defined by an electrically conductive pad positioned to be in electrical contact with the vias. After the substrate layers of the package base are fused together to form the package base, the electrical contacts can be finished, e.g., by plating electrically conductive material over the electrically conductive contacts.

The layers of substrate material, containing the conductive material for the vias and, in some examples, the electrical contacts, are stacked in a predetermined multi-tiered configuration (106). The layers of substrate material can be aligned during the stacking process such that the electrically conductive material within each layer for a particular via are aligned and in electrical contact with each other. The stacked layers are heated (106), which fuses the layers together and causes the conductive material in each layer to become electrically connected in the predetermined configuration and define a substantially continuous electrical pathway through the substrate material. After fusion of the layers, the vias define electrical pathways between two or more tiers of the package base in order to facilitate electrical connections between two or more stacked ICs within the IC package. Alternatively or additionally, the vias may form electrical pathways between one or more tiers of the package base and electrical contacts at the bottom of the package base in order to facilitate electrical connections between one or more of the stacked ICs and one or more PWBs positioned beneath the bottom of the package base.

After the package base is formed, stacked ICs, such as stacked ICs 86 (FIG. 5A), may be positioned within the package base. The stacked ICs comprise a plurality of ICs of varying heights that correspond to the heights of the tiers of the package base. Thus, each of the stacked ICs is electrically coupled via wires to electrical contacts on a tier of the package base that is at approximately the same height as the stacked IC (108).

After the stacked ICs are electrically coupled to the electrical contacts, the package base may be closed (110). In some examples, the package base is closed by placing a package lid (e.g., package lid 12 shown in FIG. 3A) and seal ring (e.g., seal ring 24 shown in FIG. 3A) over the package base, thereby substantially enclosing the stacked ICs within the IC package. The seal ring helps to create a seal (e.g., a hermetic or a near hermetic seal) between the package base and the package lid. In other examples, the package cavity may be encapsulated in a material such as epoxy, eliminating the need for a package lid and seal ring.

In some examples, after the IC package assembly, the IC package is electrically coupled to a PWB (112). Any suitable technique for electrically coupling the IC package to the PWB can be used. For example, electrical leads can be used to electrically connect electrical contacts on the IC package to conductive circuit traces of the PWB. As another example, solder balls, electrically conductive pins or solder columns can electrically connect electrical contacts on a bottom surface (e.g., bottom surface 36 shown in FIG. 3A) of the IC package and conductive circuit traces on the PWB.

FIG. 7A illustrates a schematic cross-sectional view of an example IC package assembly 114 that is electrically coupled to conductive circuit traces 120 on PWB 116 via electrical leads 118, where the cross-section is taken along an x-z plane (orthogonal x-z axes are shown in FIG. 7A for purposes of aiding the description only). IC package assembly 114 is similar to other package assemblies described herein and includes a package lid, seal ring, multi-tiered package base 115, and a plurality of ICs enclosed within a cavity defined by package base 115. Electrical leads 118 can be any suitable electrically conductive lead. Electrical leads 118 provide an electrically conductive pathway between respective electrical contacts 119, e.g., braze pads, on IC package base 114 and conductive circuit traces 120 on PWB 116. Vias 122A-122D (collectively referred to as "vias 122") electrically connect electrical contacts 124 to respective electrical contacts 119. In this way, electrical leads 118 and electrical contacts 119 electrically connect the ICs of IC package assembly 114 to PWB 116.

As shown in FIG. 7A, electrical contacts 119 are positioned on a top surface of package base 115. In other examples, electrical contacts 119 may be positioned on another surface of package base 115, e.g., a side surface or a bottom surface, or may be entirely or partially embedded within package base 115. In these examples, leads 118 may extend from a side surface of IC package 114 to PWB 116 or extend along a bottom surface of IC package 114 to PWB 116. In order to accommodate a lead 118 that is positioned along a bottom surface of IC package 114, package base 115 can define a space (e.g., a groove, divot or another type of aperture) that is configured to receive the lead 118, such that the lead 118 does not disrupt the mechanical connection between IC package base 115 and PWB 116.

Electrical leads 118 may be electrically and mechanically coupled to conductive circuit traces 120 and electrical contacts 119 using any suitable technique, e.g., brazing or soldering. In the example shown in FIG. 7A, leads 118 are connected to package base 115 in a gull wing configuration. Depending on the location of electrical contacts 119 on the surface of package base 115, electrical leads 118 can be distributed around one, two, three, or all sides of IC package base 115. In some examples, the bottom surface of IC package 114 may be mechanically coupled to PWB 116 by adhesive 123.

In the example shown in FIG. 7A, vias 122A and 122D are shown in hidden lines because they are located in a different plane than that in which the cross-section of IC package 114 is taken. As illustrated in FIG. 7A, electrically conductive via 122C extends through package base 115 from electrical contact 124C on package base 115 partially in the negative z-axis direction, partially in the negative x-axis direction, and partially in the positive z-axis direction to facilitate electrical and mechanical coupling to electrical contact 119 and, consequently, to electrical lead 118 extending from the top surface of IC package base 115. FIG. 7A also illustrates via 122B extending through package base 115 in the negative z-axis direction and forming an electrical connection with via 122C, consequently electrically connecting electrical contacts 124B and 124C. In other examples, more than two vias 122 may be electrically connected to one another within IC package 114.

Vias 122 can be connected to a common electrical contact 119 of package base 115 or at least two vias 122 can be connected to respective electrical contacts 119, as shown in FIG. 7A. The electrical contacts 119 to which vias 122A, 122D are electrically connected are not shown in FIG. 7A because the plane in which the cross-section of IC package 114 is taken results in the depiction of only two electrical contacts 119. As shown in the schematic cross-sectional view of FIG. 7A, two electrical contacts 119 are visible on the top surface of opposite sides of package base 115. In some examples, package base 115 may contain only one electrical contact 119, or may contain more than two electrical contacts 119, which may be positioned on the top, side, or bottom surfaces of package base 115. For example, electrical contacts 119 may be located at varying positions on the top surface of package base 115.

Although electrical connections between vias 122A, 122D and one or more electrical contacts 119 are not illustrated in the cross-section of FIG. 7A, in some examples, vias 122A, 122D are electrically connected to respective electrical contacts 119 located at a different position on the top surface of package base 115 than the electrical contacts 119 that are illustrated in FIG. 7A. Additionally, although FIG. 7A illustrates only two conductive circuit traces 120, in some examples, one or more electrical leads 118 may be electrically and mechanically coupled to one or more conductive circuit traces 120 at different positions on PWB 116.

Figure 7B:
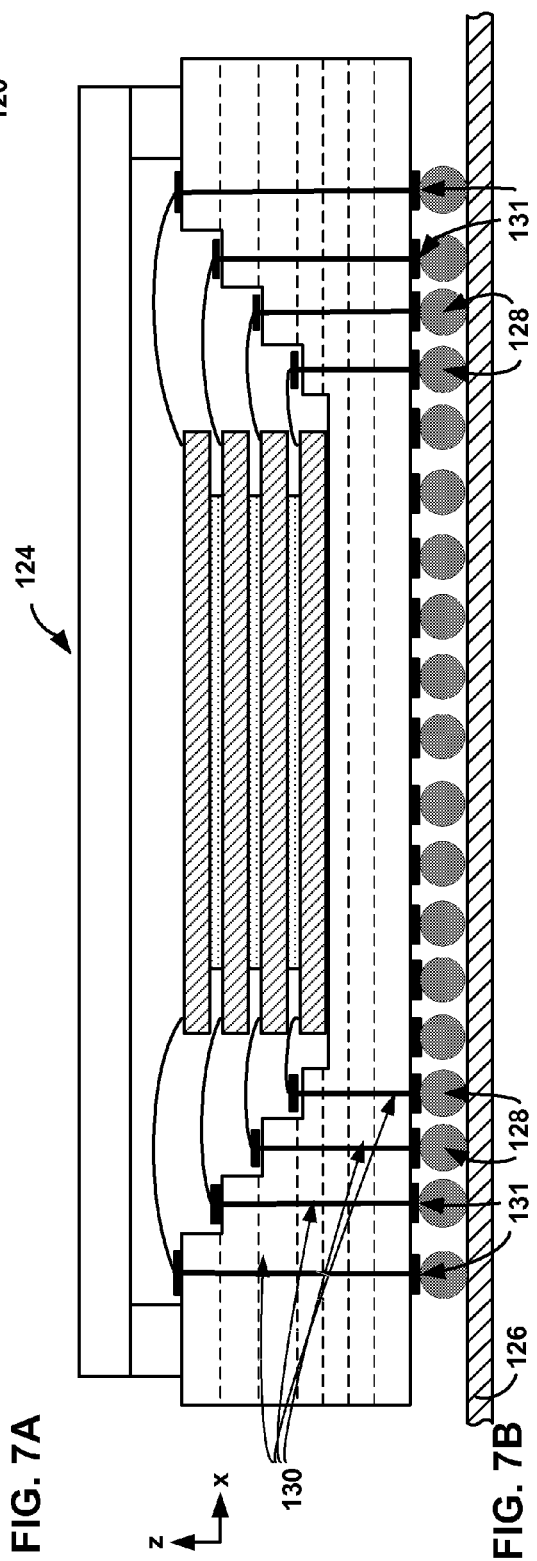
FIG. 7B is a schematic cross-sectional diagram of an IC package assembly that is electrically coupled to a PWB via a plurality of solder balls.

FIG. 7B illustrates a schematic cross-sectional view of an example IC package assembly 124 that is electrically and mechanically coupled to PWB 126 via a plurality of solder balls 128 the bottom surface of IC package 124, where the cross-section is taken along an x-z plane (orthogonal x-z axes are shown in FIG. 7B for purposes of aiding the description only). Solder balls 128 form an electrically conductive pathway between extend through the IC package base which, consequently, forms an electrically conductive pathway between the stacked ICs and the conductive circuit traces on PWB 126. In this way, solder balls 128 electrically connect the ICs of IC package assembly 124 to PWB 126.

As shown in FIG. 7B, each of vias 130 extends through the base of IC package assembly 124 in the negative z-axis direction and is electrically coupled to PWB 126 via a respective solder ball 128 between a respective electrical contact 131 and PWB 126. In other examples, one or more of vias 130 may be electrically coupled to one another within IC package 124 instead of extending through IC package 124 and, in some examples, each of vias 130 may not be coupled to a solder ball 128. Alternatively or additionally, vias 130 may be electrically coupled to conductive circuit traces on PWB 126 via another mechanism, such as solder columns or electrically conductive pins, which can be distributed along a bottom surface of IC package assembly 124, as shown in FIG. 7B with respect to solder balls 128.

Various examples have been described. These and other examples are within the scope of the following claims.

The invention claimed is:

1. A system comprising:
a package base comprising a plurality of tiers, wherein the plurality of tiers comprises a first tier and a second tier, wherein the package base defines a bottom surface, and wherein the first tier has a first height relative to the bottom surface and the second tier has a second height relative to the bottom surface;
a plurality of electrical contacts, wherein the plurality of electrical contacts comprises a first electrical contact on the first tier and a second electrical contact on the second tier;
a plurality of electrically conductive vias within the package base; and
a plurality of integrated circuits, wherein the plurality of integrated circuits comprises a first integrated circuit electrically coupled to the first electrical contact and a second integrated circuit electrically coupled to the second electrical contact, wherein the first integrated circuit is positioned substantially at the first height and the second integrated circuit is positioned substantially at the second height, wherein the first integrated circuit and the second integrated circuit are stacked in a substantially z-axis direction, and wherein the first integrated circuit and the second integrated circuit are mechanically coupled to one another.

2. The system of claim 1, wherein the first and second integrated circuits are substantially similar in size.

3. The system of claim 1, wherein the first and second integrated circuits have different sizes.

4. The system of claim 1, wherein the package base defines a bottom surface and each tier of the plurality of tiers has a different elevation relative to the bottom surface of the package base, wherein the tiers of the plurality of tiers are stacked in the substantially z-axis direction.

5. The system of claim 1, wherein the package base defines a cavity and at least two tiers of the plurality of tiers extend different distances into the cavity.

6. A method comprising:
forming a package base comprising a plurality of tiers, wherein the plurality of tiers comprises a first tier comprising a first electrical contact and a second tier comprising a second electrical contact, wherein the package base defines a bottom surface, and wherein the first tier has a first height relative to the bottom surface and the second tier has a second height relative to the bottom surface;
forming a plurality of electrically conductive vias within the package base;
positioning a first integrated circuit substantially at the first height within the package base;
coupling the first integrated circuit to the first electrical contact;
positioning a second integrated circuit substantially at the second height within the package base and stacking the second integrated circuit with the first integrated circuit in a substantially z-axis direction;
mechanically coupling the first integrated circuit and the second integrated circuit to one another; and
coupling the second integrated circuit to the second electrical contact.

7. The method of claim 6, wherein forming the package base comprising a plurality of tiers comprises stacking a plurality of substrate layers in the substantially z-axis direction to define the plurality of tiers.

8. The method of claim 7, wherein forming the plurality of electrically conductive vias within the package base comprises:
defining openings in at least two of the substrate layers; and
introducing an electrically conductive material in the openings,
wherein stacking the plurality of substrate layers comprises aligning the openings in the at least two of the substrate layers.

9. A system comprising:
a package base defining a cavity and a plurality of tiers, wherein the plurality of tiers comprises a first tier and a second tier;
a plurality of electrical contacts on the plurality of tiers, wherein the plurality of electrical contacts comprises a first electrical contact on the first tier and a second electrical contact on the second tier;
a plurality of integrated circuits, wherein the plurality of integrated circuits is configured to be electrically coupled to the plurality of electrical contacts on the plurality of tiers; and
a plurality of vias, wherein at least one of the plurality of vias is configured to electrically couple the first electrical contact to the second electrical contact.

10. The system of claim 9, wherein the package base defines a bottom surface and wherein the plurality of integrated circuits comprises a first integrated circuit configured to be electrically coupled to the first electrical contact and a second integrated circuit configured to be electrically coupled to the second electrical contact, wherein the first and second integrated circuits have different elevations relative to the bottom surface of the package base.

11. The system of claim 9, wherein the package base defines a bottom surface and each tier of the plurality of tiers has a different elevation relative to the bottom surface of the package base, wherein the tiers of the plurality of tiers are stacked in the substantially z-axis direction.

12. The system of claim 9, wherein the package base defines a bottom surface and the first tier has a first height relative to the bottom surface and the second tier has a second height relative to the bottom surface, wherein the plurality of integrated circuits comprises a first integrated circuit configured to be electrically coupled to the first electrical contact and a second integrated circuit configured to be electrically coupled to the second electrical contact, and wherein the first integrated circuit is positioned substantially at the first height and the second integrated circuit is positioned substantially at the second height.

13. The system of claim 1, wherein each via of the plurality of electrically conductive vias electrically connects to a respective electrical contact of the plurality of electrical contacts, and wherein at least two of the plurality of vias are electrically connected to each other.

14. The system of claim 1, wherein each of the first and second integrated circuits comprises electrical contacts on opposite sides of a common surface of the respective integrated circuit.

15. The system of claim 1, wherein the first integrated circuit and the second integrated circuit are mechanically coupled to one another via at least one separation layer, wherein the at least one separation layer comprises an adhesive.

16. The method of claim 6, wherein each of the first and second integrated circuits comprises electrical contacts on opposite sides of a common surface of the respective integrated circuit.

17. The method of claim 6, wherein mechanically coupling the first and second integrated circuits to one another comprises mechanically coupling the first and second integrated circuit to one another via at least one separation layer, wherein the at least one separation layer comprises an adhesive.

18. The system of claim 9, wherein at least two vias of the plurality of vias are electrically connected to each other.

19. The system of claim 9, wherein at least two integrated circuits of the plurality of integrated circuits are mechanically coupled to one another via at least one separation layer, wherein the at least one separation layer comprises an adhesive.

20. The system of claim 9, wherein at least two integrated circuits of the plurality of integrated circuits comprise electrical contacts on opposite sides of a common surface of the respective integrated circuit.

* * * * *